(12) United States Patent
Hodges et al.

(10) Patent No.: US 10,923,896 B2
(45) Date of Patent: Feb. 16, 2021

(54) MODULAR ELECTRICAL CONTROL SYSTEM

(71) Applicant: Google LLC, Mountain View, CA (US)

(72) Inventors: Mitchell T. Hodges, Plainfield, IL (US); Michael J. Lombardi, Lake Zurich, IL (US); Sajid Dalvi, Aurora, IL (US); Joseph Allore, Mundelein, IL (US); Krzysztof Szot, Carol Stream, IL (US)

(73) Assignee: Google LLC, Mountain View, CA (US)

( * ) Notice: Subject to any disclaimer, the term of this patent is extended or adjusted under 35 U.S.C. 154(b) by 273 days.

(21) Appl. No.: 16/176,771

(22) Filed: Oct. 31, 2018

(65) Prior Publication Data

US 2020/0136362 A1 Apr. 30, 2020

(51) Int. Cl.
*H02G 3/08* (2006.01)
*H02G 3/12* (2006.01)
*H02G 3/38* (2006.01)
*H05K 7/14* (2006.01)

(52) U.S. Cl.
CPC ............. *H02G 3/126* (2013.01); *H02G 3/38* (2013.01); *H05K 7/1432* (2013.01); *H05K 7/1472* (2013.01)

(58) Field of Classification Search
CPC .......... H02G 3/08; H02G 3/081; H02G 3/126; H02G 3/12; H02G 3/38; H05K 5/00; H05K 5/02; H05K 7/00; H05K 7/14; H05K 7/1472; H05K 7/1432; H05K 7/1427

USPC .............. 174/50, 53, 57, 58, 520, 480, 481; 220/3.2–3.9, 4.02; 439/535, 536; 361/600, 601; 248/906
See application file for complete search history.

(56) References Cited

U.S. PATENT DOCUMENTS

| | | | |
|---|---|---|---|
| 6,937,461 B1* | 8/2005 | Donahue, IV | H01R 13/514 174/50 |
| 7,312,396 B1* | 12/2007 | Gorman | H02G 3/125 174/480 |
| 7,323,638 B1* | 1/2008 | Radosavljevic | H01R 13/447 174/53 |
| 7,497,273 B2* | 3/2009 | Schoettle | H01R 13/665 173/53 |
| 8,158,883 B2* | 4/2012 | Soffer | H02G 3/123 174/50 |
| 8,415,561 B2* | 4/2013 | Gates | H01R 24/22 174/50 |

* cited by examiner

*Primary Examiner* — Angel R Estrada
(74) *Attorney, Agent, or Firm* — Butzel Long; Donald J. Lecher

(57) ABSTRACT

A modular electrical control system includes a switch module, having at least an "on" state and an "off" state, configured to draw power from an AC power source and to control power delivery to at least one external load, the switch module including a detector that determines whether a neutral wire is connected to the switch module, and a removable user interface module configured to connect to the switch module and receive power from the switch module, wherein the switch module delivers a first amount of power to the user interface module when the detector determines that the neutral wire is connected to the switch module, and delivers a second amount of power to the user interface module lower than the first amount of power when the detector determines that the neutral wire is not connected to the switch module.

18 Claims, 7 Drawing Sheets

MODULAR ELECTRICAL CONTROL SYSTEM

BACKGROUND

It will be appreciated that this Background section represents the observations of the inventors, which are provided simply as a research guide to the reader. As such, nothing in this Background section is intended to represent, or to fully describe, prior art.

Lighting controls remain one of the most common devices in the world. They are in nearly every country, in most homes and rooms. In addition to widespread use, the appearance and functionality of the basic light switch remains virtually identical to what was provided in the original disclosure of the toggle light switch in 1917. However, new functions like dimming, motion-based activation and programmed lighting schedules have been implemented in various forms. Companies have also integrated modern connectivity solutions into the standard light switch, allowing it to be controlled remotely via smartphone or other electronic device.

Since lighting controls are often found at the entrances of rooms and have a source of constant power, it would be advantageous to use the location of lighting controls for additional functions. Since the useful functions may differ by room, home or user, it would also be useful for the additional functionality to be modular such that different types of functionality could be employed in different settings, utilizing the same underlying switch design.

BRIEF SUMMARY

According to an embodiment of the disclosed subject matter, a modular electrical control system for installation in an electrical box of a premises includes a switch module having at least an "on" state and an "off" state, being configured to control power delivery to at least one external load, the switch module including a detector that determines whether a neutral wire is connected to the switch module, and a removable user interface module configured to connect to the switch module and receive power from the switch module, the removable user interface module including a processor that receives a signal from the switch module indicating whether a neutral wire is present and transmits an instruction to set the switch module to a first power operation mode when then detector determines the neutral wire is connected to the switch module and sets the switch module to a second power operation mode when the detector determines that the neutral wire is not connected to the switch module, wherein the switch module, in the first power operation mode, draws a first amount of power from a live wire of the premises with a return path being established by a connection to the neutral wire, and in the second power operation mode draws a second amount of power from a current that is delivered to the external load.

According to an embodiment of the disclosed subject matter, a modular electrical control system includes a switch module, having at least an "on" state and an "off" state, configured to draw power from an AC power source and to control power delivery to at least one external load, the switch module including a detector that determines whether a neutral wire is connected to the switch module, and a removable user interface module configured to connect to the switch module and receive power from the switch module, wherein the switch module delivers a first amount of power to the user interface module when the detector determines that the neutral wire is connected to the switch module, and delivers a second amount of power to the user interface module lower than the first amount of power when the detector determines that the neutral wire is not connected to the switch module.

Additional features, advantages, and embodiments of the disclosed subject matter may be set forth or apparent from consideration of the following detailed description, drawings, and claims. Moreover, it is to be understood that both the foregoing summary and the following detailed description are illustrative and are intended to provide further explanation without limiting the scope of the claims.

BRIEF DESCRIPTION OF THE DRAWINGS

The accompanying drawings, which are included to provide a further understanding of the disclosed subject matter, are incorporated in and constitute a part of this specification. The drawings also illustrate embodiments of the disclosed subject matter and together with the detailed description serve to explain the principles of embodiments of the disclosed subject matter. No attempt is made to show structural details in more detail than may be necessary for a fundamental understanding of the disclosed subject matter and various ways in which it may be practiced.

DETAILED DESCRIPTION

Figure 1:
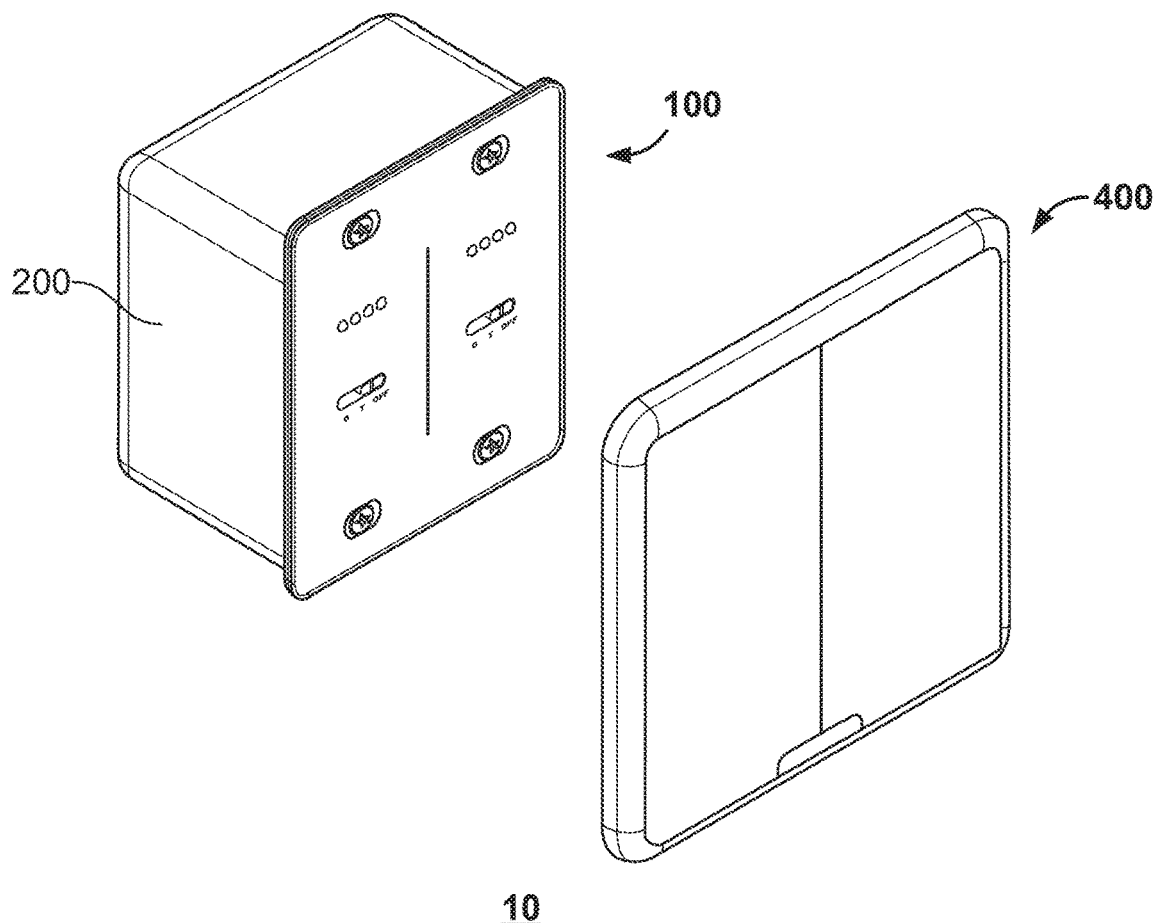
FIG. 1 shows an electrical control system according to an embodiment of the disclosed subject matter.

The following description is based on embodiments of the disclosed principles and should not be taken as limiting the claims with regard to alternative embodiments that are not explicitly described herein. Also, various aspects or features of this disclosure are described with reference to the drawings, wherein like reference numerals are used to refer to like elements throughout.

In this specification, numerous details are set forth in order to provide a thorough understanding of this disclosure. It should be understood, however, that certain aspects of disclosure may be practiced without these specific details, or with other methods, components, materials, etc. In other instances, well-known structures and devices are depicted in block diagram form to facilitate describing the subject disclosure.

Lighting controls are frequently found at the entry points of rooms within residential, commercial and industrial buildings. They are installed within switch boxes which are typically attached to the underlying structure of the building.

Lighting controls have a standardized attachment scheme such that they can be installed, replaced and/or upgraded over time without modification to the switch box. Multiple lighting controls may be installed within the same switch box. These configurations are often referred to as multi-gang installations and "single-gang", "dual-gang", "triple-gang" refer to the number of lighting controls present in the same switch box.

A traditional simple light switch is essentially a mechanical device that does not require a power source to operate. However, modern "smart switches" that provide additional features, such as, for example, network access that allows the switch to be controlled by a smart phone, require power to operate. Many homes in the US and around the world were built before smart switches appeared on the market and do not include electrical box configurations that support smart switches. For example, up to 50% of electrical boxes in US homes do not have a neutral wire available, and conventional smart switches require a neutral wire detached from the load to provide a return path for received power.

Disclosed embodiments of an electrical control system can connect to existing wiring in a premises in any of a variety of configurations and function with or without a neutral wire detached from the controlled load. The disclosed electrical control system include an in-wall light switch module and a user interface module that attaches and electrically connects to the switch module. The switch module can function in multiple power modes and automatically determine which mode to operate in after it has been installed. Various features described with respect to the embodiments of the disclosed electrical control system may be omitted or included in different combinations than depicted/described in the examples discussed below.

FIG. 1 depicts an embodiment of an electrical control system 10 according to the disclosed subject matter, including a switch box 200 housing one or more switch modules that draw power for the system 10 and implement switch functionality, a wall plate 300 covering the one or more switch modules, and a user interface (UI) module 400 to provide a user with an interface to control the system 10. The configuration depicted is a dual-gang configuration having two switch modules, however, the switch modules, wall plate 300 and UI module 400 can be made in various configurations to accommodate different size and feature requirements.

Figure 2:
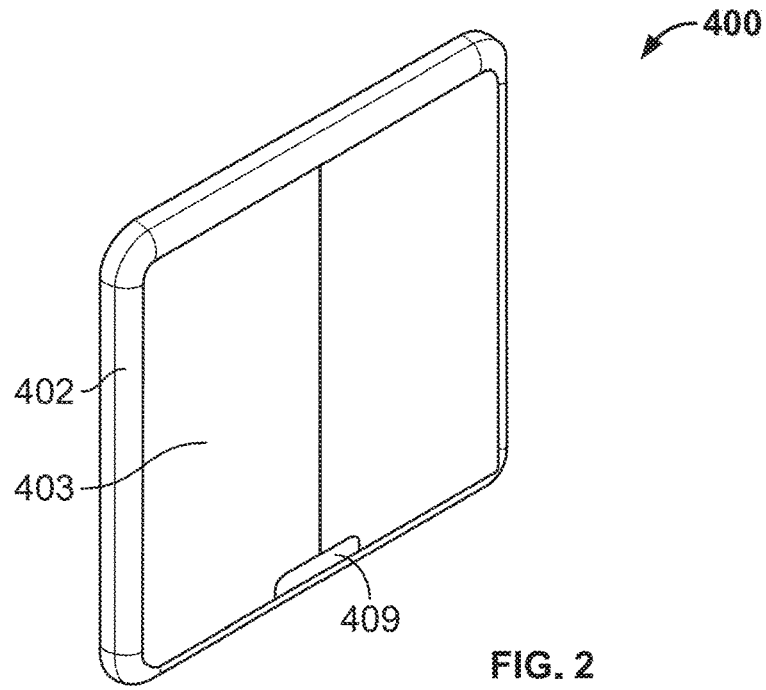
FIG. 2 shows an angled view of a user interface module according to an embodiment of the disclosed subject matter.

FIG. 2 is an angled view of a UI module 400 according to the disclosed subject matter. The UI module includes a lens 403 and front housing 402. An optional sensor lens 409 is included in this embodiment. As will be described below, the UI module 400 provides smart switch functionality and can include certain elements, such as touch sensors and light emitting diodes (LED's), that require an amount of power to operate.

Figure 3:
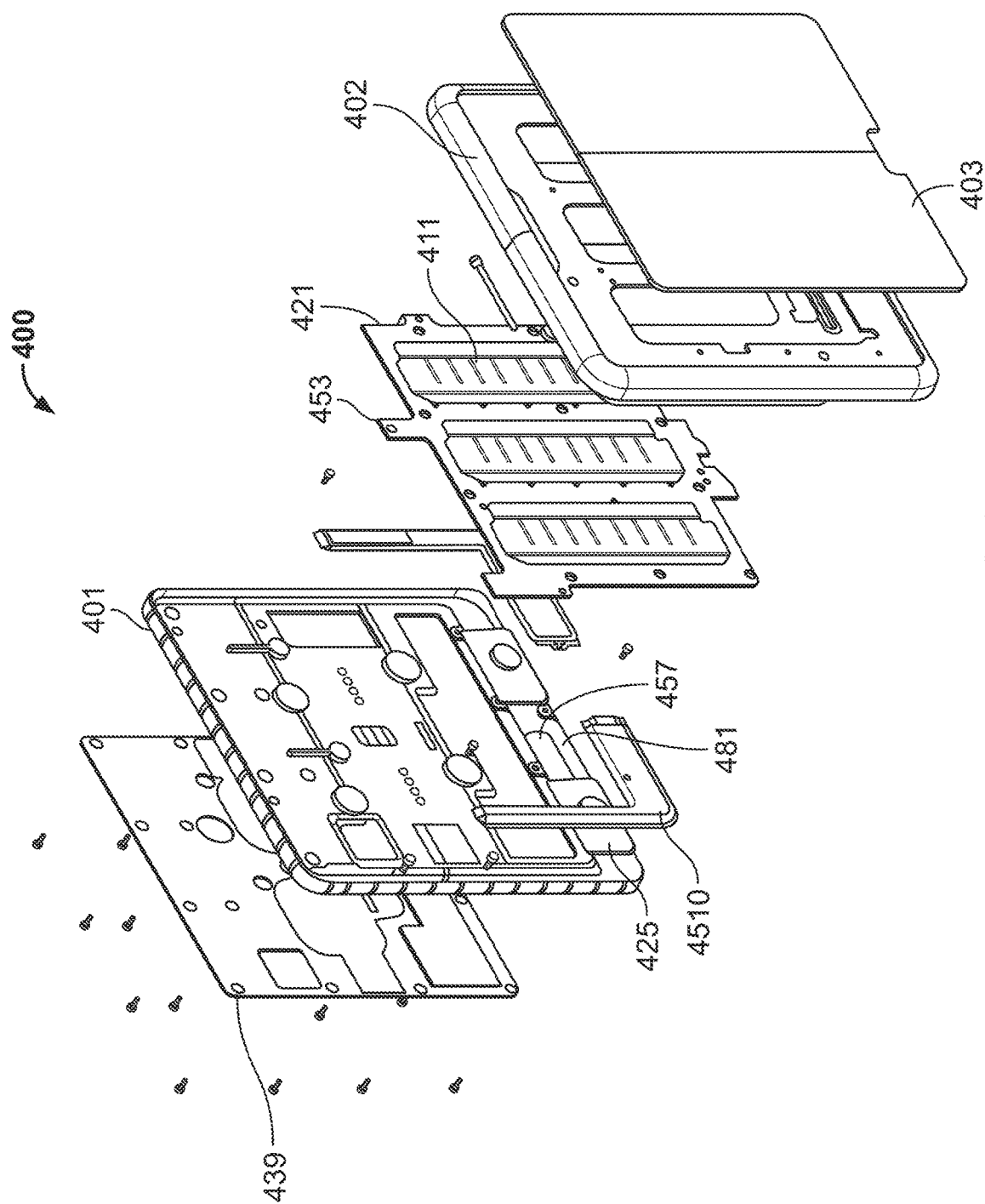
FIG. 3 shows an exploded view of a user interface module from the front according to an embodiment of the disclosed subject matter.

FIG. 3 is an exploded, angled view of an embodiment of the UI module 400 from the front and illustrates an example layout of certain powered internal components. In this layout an infrared (IR) motion sensor 457 is oriented towards a mirror 481 to direct the light from the sensor lens 409 (FIG. 2) towards the IR motion sensor 457. One or more speakers 425 may be located within an acoustic housing 4510 and connected to a printed circuit board (PCB) assembly 421, which includes a processor and various controllers. The PCB assembly 421 can include a microphone 453. The PCB assembly 421 can also include, beneath a light guide assembly 411, a plurality of LEDs (not depicted) to provide output and a plurality of touch sensors (not depicted) to receive input. To diffuse the light emitted by the LEDs, the light guide assembly 411 can be implemented as molded plastic, film sheets, or the like. A rear cover 439 attaches to the rear housing 401.

The UI module 400 can implement an interface for smart switch functionality, for example, by the PCB assembly 421 controlling the LED's to produce different modes of lighting through the light guide assembly 411 and thereby showing various statuses or states of the electrical control system 10, or providing other audio/visual information to a user. The lens 403 can comprise printed artwork such as an additional masked pattern that allows light to be emitted only in certain areas.

Figure 4:
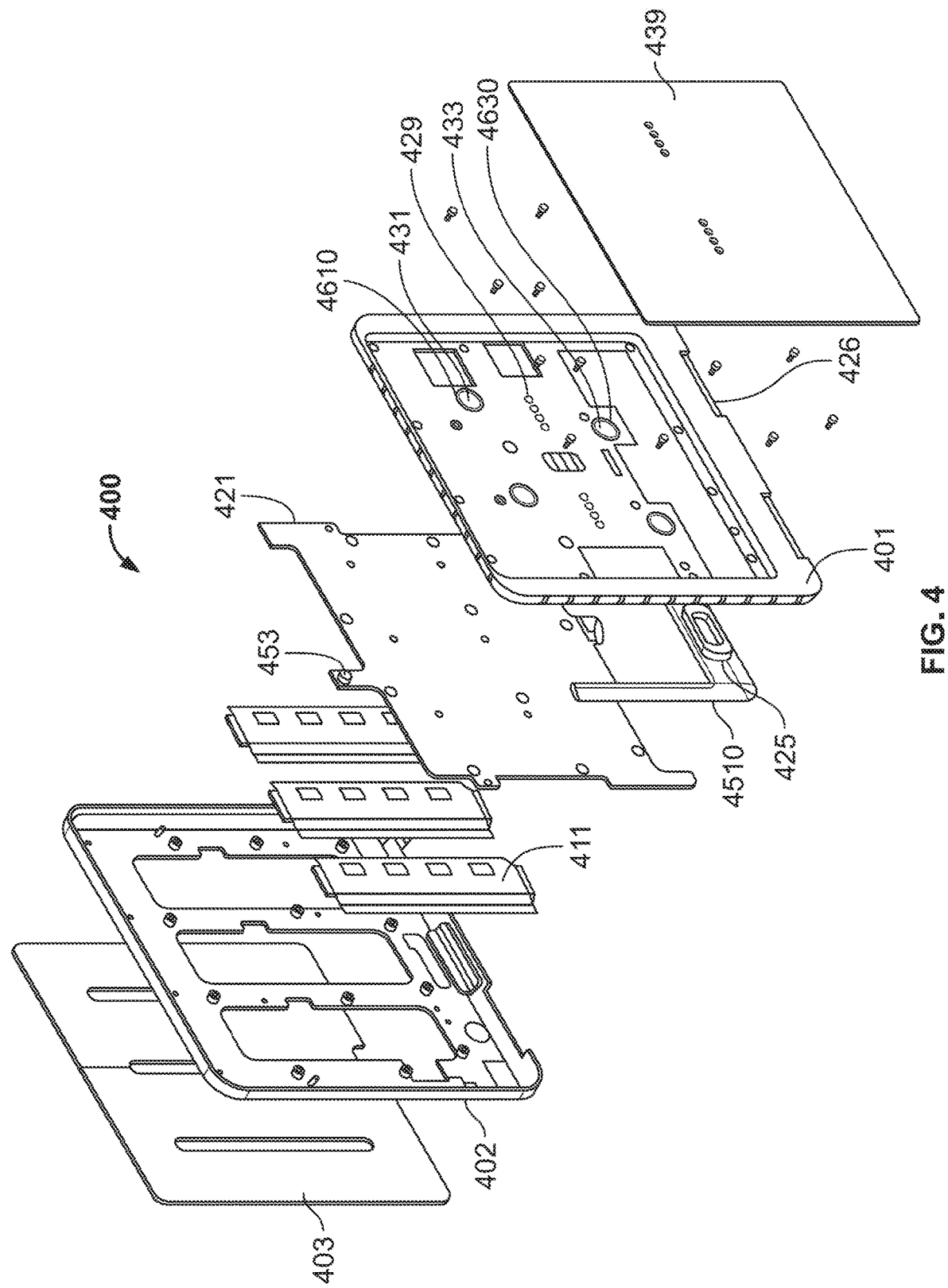
FIG. 4 shows an exploded view of a user interface module from the rear according to an embodiment of the disclosed subject matter.

FIG. 4 is an exploded, angled view of an embodiment of the UI module 400 from the rear, depicting an example layout of various components that interact with the switch module 100 (FIG. 1). The UI module 400 includes a mechanism for attaching or fastening to an underlying switch module. The mechanism can be implemented, for example, via magnets, hooks, slots, clips or other types of fasteners. As will be described below, the UI module can also include a data transmission system to communicate with the switch module, for example, pins or a transceiver, an IR light emitter and IR light detector or the like, and a power transmission system to supply power to or receive power from a switch module.

The embodiment depicted in FIG. 4 includes contact pins 429 to receive/transmit power and transmit/receive data, and retention magnets 431, 433 surrounded by ferrous steel shrouds 4610, 4630 to attach to the switch module 100. One or more audio ports 426 can be formed in the rear housing 401.

The UI module 400 is not limited to the embodiment or component layouts depicted in FIGS. 3-4, but can also be constructed with different layouts and include other sensors to detect, for example, temperature, humidity, ambient light, and motion. In one embodiment, a UI module 400 can include one or more of a video camera, ambient light sensor, and motion sensor. The UI module may be configured to operate in a variety of modes of operation including: lighting control idle mode, lighting control active mode, security active mode and security idle mode.

Figure 5:
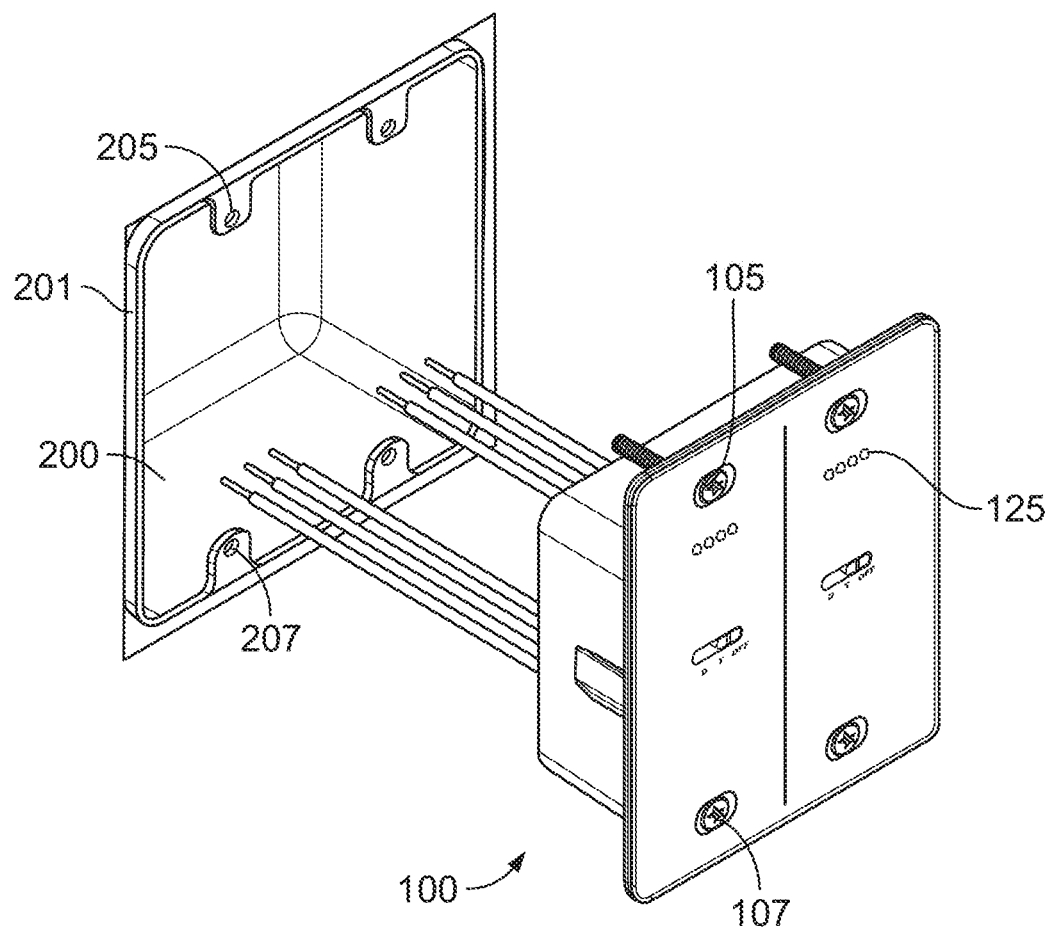
FIG. 5 shows an exploded view of a switch module according to an embodiment of the disclosed subject matter.

Turning now to details of the disclosed switch module 100, FIG. 5 depicts an angled, exploded view of a switch module 100 assembly in switch box 200. The switch box 200 has threaded holes, e.g., 205, 207 to retain the switch module 100 using screws, e.g., 105, 107. In typical applications the switch box 200 is surrounded by building material 201 such as drywall. In the embodiment depicted, the switch module 100 is installed into a dual gang switch box 200. The switch module 100 includes contact pins 125 which may transmit power to the UI module 400 and receive data signals from the UI module 400.

Figure 6:
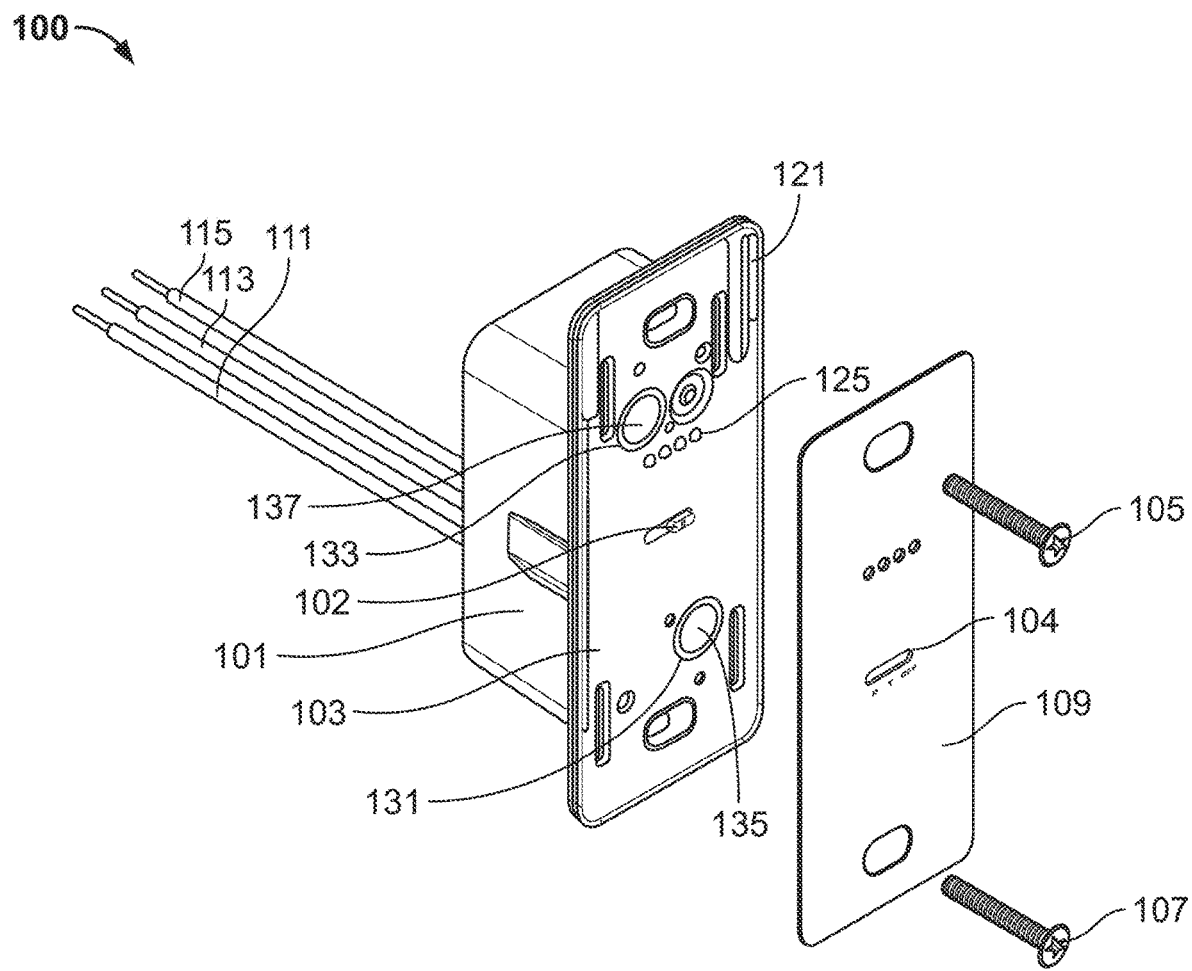
FIG. 6 shows another exploded view of a switch module according to an embodiment of the disclosed subject matter.

FIG. 6 is an angled, exploded view of a switch module 100 in a single-gang configuration. A first screw 105 and second screw 107 are used to retain the switch module 100 to a switch box. The switch module 100 includes front cover 109, front housing 103, and a main housing 101 that holds most of the internal components of the switch module 100, including a printed circuit board PCB assembly (not shown). The layout and configuration of the PCB and internal components can change based on the implementation of different features.

The switch module 100 includes a plurality of connectors 111, 113, 115 for connecting the switch module 100 to a building's existing electrical wiring, e.g., through a gang box. The connectors 111, 113, 115 allow the switch module 100 to draw electrical power from the building and to execute switching functionality for the load (e.g., light, fan, etc.) that the switch module 100 is installed to control.

In the main housing 101, the switch module 100 can include a power transmission system to transmit power to the UI 400, for example, using contacts or a wireless power transmission coil. The embodiment depicted in FIG. 6 includes contact pins 125 configured to transmit power to a UI module (not shown) when attached to the UI module.

The switch module 100 includes an antenna 121 disposed behind the front cover 109 to allow wireless communication with external electronic devices, e.g., smart phones, tablets, laptops, smart watches, etc. The antenna also can be used by one switch module to communicate with another switch module, for example, using wireless networking standards such as IEEE 802.15.4, which higher level protocols such as ZigBee and Thread are based on. Thus, multiple switch modules throughout a home can communicate with each other. In other embodiments, the switch module may offer no wireless connectivity and such connectivity may be included in the UI module.

Instead of peer-to-peer or one-to-many network topologies, a plurality of switch modules installed in a home may form a mesh network such that a single point of failure does not impact connectivity for other devices in the home. When a UI module 400 physically docks over a switch module 100 that is connected to the wireless mesh, the UI module 400 can use the contact pins 125 to communicate with the underlying switch module 100 and send commands and/or data through the mesh network instead of directly joining the wireless mesh. Using this configuration a UI module 400 can control any switch module on the mesh network and is not limited to controlling a switch module physically connected to the UI module.

Referring back to FIG. 6, the switch module 100 can also include a mechanism for attaching or fastening to the UI module, for example, magnets, hooks, slots, clips or other types of fasteners. In the embodiment depicted, two magnets 135, 137 are disposed behind the front cover 109, surrounded by two ferrous steel shrouds 131, 133 on all sides other than the side facing the front cover 109. The magnets 135, 137 can passively maintain a force that can be used to hold a UI module against the switch module 100, providing an additional advantage of reducing the number of parts that require interlocking or clicking that are susceptible to wear and tear.

The switch module 100 can also include a data transmission system, for example, data/power contact pins, a transceiver, an infrared (IR) light emitter and IR light detector or the like. In one embodiment, the IR light emitter and IR light detector on the switch module 100 may be part of the same physical component. In the embodiment depicted in FIG. 6 contact pins 125 protrude through the front cover 109 and function as a data transmission system.

The switch module 100 itself can also implement a tactile switch (not shown) such that if a user presses on a front face of the switch module 100 the tactile switch will actuate and trigger an input to control a load, such as a light or fan, or trigger execution of an operation on a different device, such as turn on/off a radio. An indicator can be included on the front cover 109 to show a region for the user to press to actuate the switch module.

Turning now to cooperation between the UI module 400 and the switch module 100, referring to FIGS. 4 and 6, retention magnets 431, 433 can be positioned to draw the UI module 400 into alignment with the magnets 135, 137 of the switch module 100. In this manner, the UI module 400 is automatically retained in proper alignment and position with the switch modules 100 by the retention force of the magnets.

Once aligned and in contact, the processor 151 causes the switch module 100 to begin transmitting power to the UI module 400, e.g., via power contact pins 161. The UI module 400 receives the power transmitted from the switch module 100, automatically begins to boot up and starts communicating with the switch module 100, e.g., via the data contact pins 125, 429.

Immediately after boot up of the UI module 400, the UI module 400 sends signals to indicate that a valid device is docked over the switch module 100. If the switch module 100 receives data confirmation that a valid UI module is docked to it, then it continues to provide power to the UI module 400. If the switch module 100 does not receive confirmation that a valid UI module is present, then despite the initial contact the switch module 100 will shut down the power transmission. This prevents the switch module 100 from continuously transmitting power in the presence of an incompatible device. After the switch module 100 receives confirmation that a valid UI module is present, the switch module 100 sends a series of initial setup data to the UI module 400, e.g., via the data contact pins 125, 429. The setup data can include an identifier for the switch module 100 and identifiers for other networks or network components that the switch module is in communication with. The UI module 400 and switch module 100 are then free to communicate on an as-needed basis while they continue to operate.

If the UI module 400 is removed from the switch module 100, a break in contact of the data/power contact pins 125, 429, 161, 461 will occur. Based on this change the switch module 100 detects the removal of the UI module 400 and shuts down the power transmission.

Figure 7A:
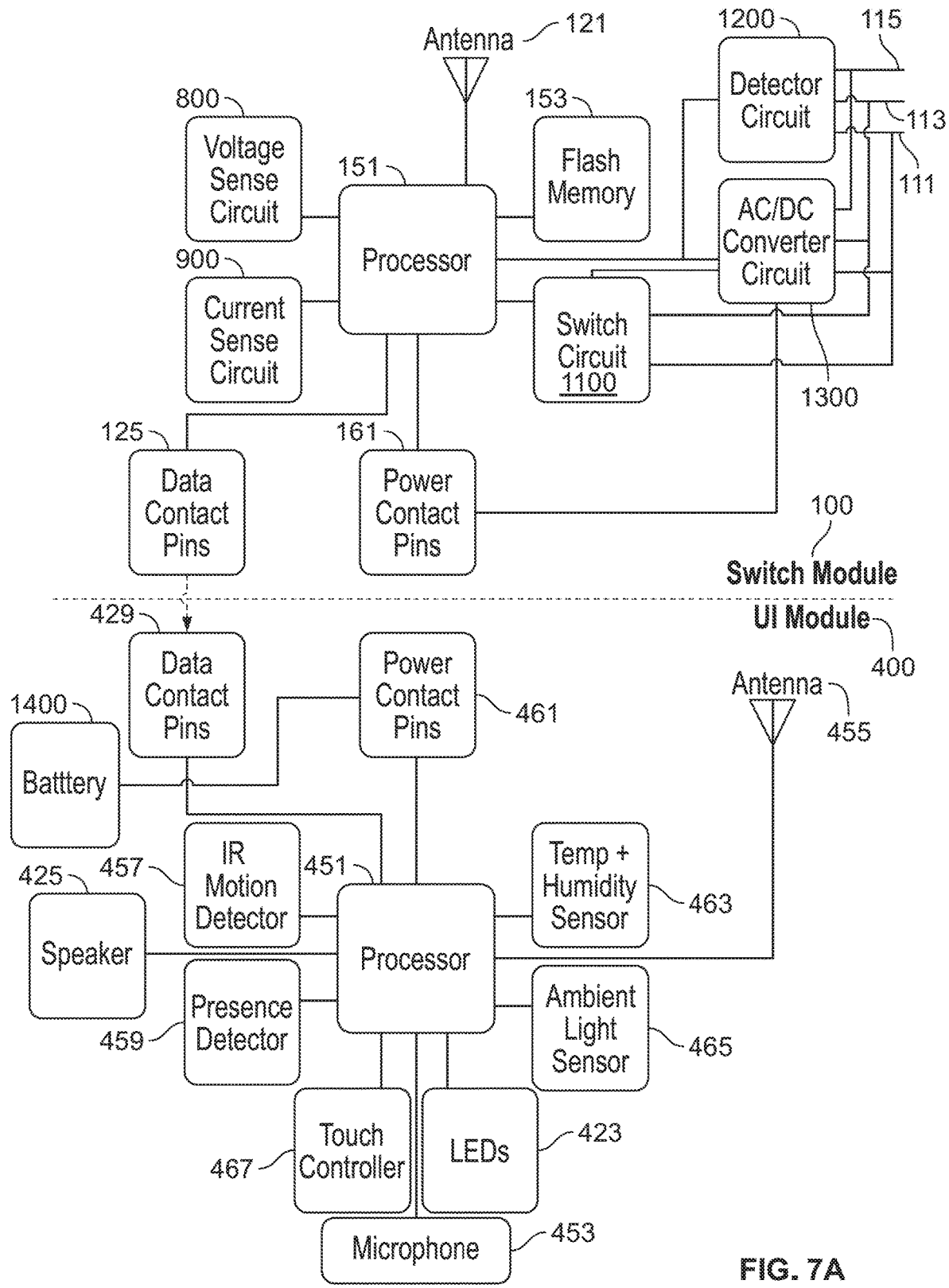
FIG. 7A shows a block diagram of a switch module and user interface module according to an embodiment of the disclosed subject matter.

FIG. 7A is a block diagram of the switch module 100 and the UI module 400. The switch module 100 includes a processor 151 which controls functions executed by the switch module 100. The processor 151 may also comprise its own memory, modem and/or other functions to comprise a "system on a chip" (SoC). The switch module 100 can include a Hall Effect sensor (not depicted) connected to the processor 151 and can include one or more secondary processors (not depicted) to handle certain designated functions or to otherwise aid the processor 151. The switch module 100 also powers contact pins 161 that are capable of transmitting power to the UI module 400.

Processor 151 can transmit signals, data and commands to the UI module 400 via data contact pins 125. Data contact pins 125 can be separate from power contact pins 161 or can be one and the same. The switch module 100 can include flash memory 153 external to the processor 151. The switch module 100 also includes an antenna 121 connected to the processor 151. The switch module 100 further includes a switch circuit 1100, detector circuit 1200, and AC-DC converter circuit 1300 connected to and controlled by the processor 151.

Figure 7B:
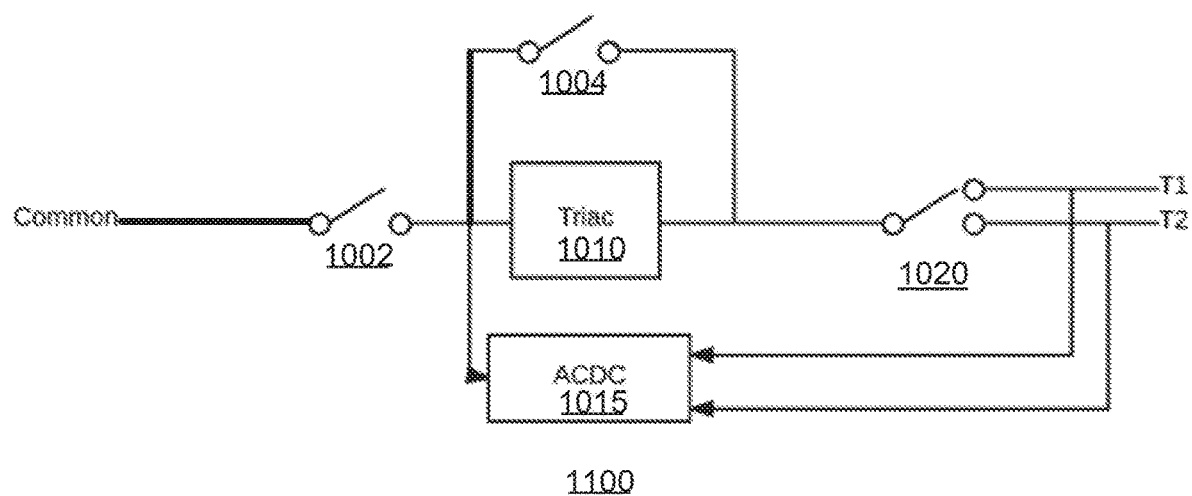
FIG. 7B shows an example configuration of a relay circuit and TRIAC of a switch circuit according to an embodiment of the disclosed subject matter.

FIG. 7B depicts a block diagram of a switch circuit 1100 which can be included in an embodiment of the disclosed switch module 100. The switch circuit 1100 includes a first relay 1002, a second relay 1004, a TRIAC 1010, an AC-to-DC converter circuit 1015, and a third relay 1020. Additional components not depicted can be included in the switch circuit 1100. The setting of the first relay 1002 and second relay 1004 can be controlled by the slidable switch 102 (FIG. 6). That is, in one configuration first relay 1002, for example, can be opened by moving the slidable switch 102 into a first position, second relay 1004 can be opened by moving slidable switch 102 moving into a second position, and both relays 1002, 1004 can be simultaneously closed by moving the slidable switch 102 into a third position.

The two relays 1002, 1004 and TRIAC 1010 can enable either of a toggle or dimmer mode of operation. That is, if the user wishes to control a load using on/off toggle commands without dimming, the user can move the slidable switch to the third position to set the first relay 1002 and the second relay 1004 both closed. If the user wishes to control a load using dimming functionality, the user can move the slidable switch into the second position to set the first relay 1002 closed and second relay 1004 open. Whenever the user wishes to cease providing power to the load the user can move the slidable switch to the first position to set the first relay 1002 open, thereby creating an air gap in the switch circuit 1100 between the common terminal and the load.

Referring back to FIG. 7A, the switch module 100 can include a voltage sense circuit 800 and a current sense circuit 900. These circuits allow the switch module 100 to monitor amounts of power used by the load attached to it.

The UI module 400 has a processor 451 that can be similar to that of the switch module 100. The processor 451 may have additional components and functionality embedded to comprise a SoC. The UI module 400 can include an antenna 455 which allows two way data communication using protocols such as WiFi. Additional antennas and wireless protocols may be implemented as well but are omitted from the illustration for simplification.

The UI module 400 can include data contact pins 429 and power contact pins 461 to receive/transmit data from the processor 451 and to receive power from the switch module 100 to power the UI module 400 components and charge battery 1400. Data contact pins 429 can be separate from power contact pins 461 or can be one and the same. In one implementation the processor 451 can transmit a status request to the switch module 100 to check, for example, which mode the switch module 100 is set in or a state of the load controlled by the switch module 100. Based on the received response, the processor 451 can control the UI module 400 to display an appropriate interface. In this way the UI module 400 can display an interface in accordance with setting of the slidable switch that sets the switch module 100 operational mode.

The UI module 400 also includes a speaker 425 and microphone 453 connected to the processor 451. As previously mentioned, LEDs 423 are included in the UI module 400 and are connected to and controlled by the processor 451 to, for example, display a load status or function as part of an interface. A variety of sensors can be connected to the processor 451, including: temperature and humidity 463, ambient light 465, touch 467, presence 459 and motion 457.

Referring to FIGS. 6 and 7A, the switch module 100 includes a plurality of connectors 111, 113, 115 for connecting the switch module 100 to a building's existing electrical wiring, e.g. through a gang box. The connectors 111, 113, 115 allow the switch module 100 to draw electrical power from the building and to implement the principal switching functionality for the load (e.g., light, fan, etc.) that the electrical control system is installed to control. For example, connector 111 can connect to a building's hot or live line, connector 113 can function as a switched-live connector to connect to a load, and connector 115 can connect to neutral wire to complete a return path through the neutral wire. By controlling whether a circuit having a path through switch-lived connector 113 and hot connector 111 is open or closed the switch module 100 can control an amount of power delivered to a load.

As of the time of this filing an estimated 50% of the light switch electrical boxes in U.S. homes do not have a neutral wire available. Instead, the electrical boxes have a setup referred to as a 2-wire lighting system, i.e., a gang box having an outgoing ground wire, a live (or hot) wire that delivers a live supply voltage to the switch, and a switched-live wire that delivers the supply to the load when the switch is closed. Conventional smart switches that require power to operate cannot function in a 2-wire lighting system due to the lack of a neutral return path for power that is needed to drive the smart switch itself. In contrast, one of the advantages that the disclosed electrical control system provides is the option of drawing power from the supply to drive the switch system, even when operating in a 2-wire lighting system.

The disclosed electrical control system can therefore function in multiple power modes. Detector circuit 1200 can include a ground connection line and neutral wire connection line and automatically determine whether a neutral wire is present. For example, in one embodiment in a two-step process the detector circuit can: 1) determine whether a ground connection is present by comparing a signal from a ground connection line against a threshold; and 2) determine whether a neutral wire is present by digitizing a signal received from a neutral wire connector. When a neutral wire and ground connection are both present, the detector circuit 1200 will sense a 60 Hz toggle. When a neutral wire is present without ground present, the detector circuit 1200 will see inverted results. When no neutral wire is present, the detector circuit will sense a zero value.

After a UI module 400 is connected to one or more switch modules 100, the UI module 400 transmits a command to the switch module 100 requesting the status of whether a neutral wire is present. When the switch module 100 responds with a signal indicating that a neutral wire is present, the UI module 400 sets the switch module 100 to operate in a first power mode, as will be described below. When the switch module 100 responds that a neutral wire is not present, the UI module 400 sets the switch module 100 to operate in a second power mode.

In the first mode (i.e., when a neutral wire is detected), the AC-DC converter circuit 1300 directly draws an amount of current from alternating current (AC) supplied to the switch module 100 via live connector 111. The AC-DC converter circuit 1300 converts the AC line power to a first amount of direct current (DC) power, which can then be delivered to the UI module's wireless power contact pins 461. In this manner the switch module 100 captures the first amount of power through a closed loop from the building AC power source with a return path being established through the connector 115 to the electrical box neutral wire. The first amount of power can be captured at the same rate whether the switch module 100 itself is in the "on" state or the "off" state.

In the second mode (i.e., when a neutral wire is not detected), AC power is captured through a TRIAC in the switch circuit 1100 by controlling the TRIAC to allow a pre-determined amount of current to pass through the load. The AC-DC converter circuit 1300 converts the captured AC power to a second amount of DC power. Generally, due to differences in power availability the first amount of DC power captured through the neutral wire connector 115 will potentially be significantly greater than the second amount of DC power captured through the switch circuit 1100 TRIAC.

Thus, the switch module 100 can deliver a first amount of power to the UI module 400 when the detector circuit 1200 determines that a neutral wire is connected to the switch module 100, and deliver a second amount of power to the UI module 400 lower than the first amount of power when the detector circuit 1200 determines that the neutral wire is not connected to the switch module 100.

To maximize the second amount of power, while operating in the second power mode the switch module 100 can capture power both when the user places the switch in the "off" state (i.e., the user intends for the load to be turned off) and when the user places the switch in the "on" state (i.e., the user intends for the load to be turned on). This can be achieved differently in the two states so as to not affect the normal operation of the load. In the "off" state, the switch module 100 is configured to allow a small enough amount of current to pass through the TRIAC of the switch circuit 1100 (and consequently, the load as well) such that the perceived state of the load to the user remains "off," even while the switch circuit 1100 captures AC power for conversion to DC power. When a user turns the switch "on," part of the supply AC waveform delivered to the load is captured by the switch circuit 1100 and converted to DC power by the AC-DC converter circuit 1300 while the rest of the AC waveform is supplied to the load.

The amount of the AC waveform captured in either the "on" state or the "off" state is pre-determined such that there is no perceived negative or undesirable effect on the load. For example, if too much power is captured by the switch module 100 operating in the second power mode while in the "on" state an attached load of a light bulb might flicker or flash rather than providing a consistent source of light. Conversely, if too much current is allowed to flow through the load while the switch module operates in the second power mode in an "off" state, a load of a light bulb which should be "off" may give off a faint glow.

Accordingly, the switch module 100, when in the "off" state, captures the second amount of power through a TRIAC by allowing a first amount of current to pass through the TRIAC and the external load, the first amount of current being insufficient to power the external load. Conversely, the switch module 100, when in the "on" state, captures the second amount of power by converting a part of an AC waveform being delivered to the external load, the first part of the AC waveform being insufficient to diminish operation of the external load.

Further system differentiation of how much power is captured in the "off" state or "on" state can help improve consistent and reliable functionality of the disclosed electrical control system. Generally, in the second power mode the amount of captured power should be lower when the switch module is in the "off" state than it is when the switch module is in the "on" state. However, in some embodiments it can be beneficial to capture a single predetermined amount of power regardless of the on/off state of the switch module 100 while in the second power operation mode. Generally, capturing approximately 200 mW in U.S. homes results in high compatibility with most lightbulbs (i.e., low enough to avoid operational defects such as flicker or glow) and is enough to power both the switch module 100 and the UI module 400 with at least basic functionality.

Since the second amount of DC power is relatively low, the switch module 100 and UI module 400 can be configured to automatically support a limited feature set while operating in the second power mode in order to increase the chances that the system always has sufficient power to operate, regardless of the functional state of the load. To power additional functionality of the system, any residual DC power not consumed by operation of the switch module 100 or UI module 400 can be stored in a power storage device, such as battery 1400 (FIG. 7A). Through this method, the UI module 400 can charge the battery 1400 continually throughout the day/night, and when high power needs are encountered, such as illuminating a user interface or transmitting information to a WiFi network, the UI module 400 can optionally utilize power from battery 1400. Furthermore, the UI module 400 can be powered by the battery 1400 entirely when detached from the switch module 100.

The switch module 100 can automatically transmit a notice signal to the UI module 400 to cause the UI module 400 to reduce a number of available operational functions when the detector determines that neutral wire is not connected to the switch module. When operating with limited features, the limited feature set should be determined such that the total amount of battery power consumed throughout the primary usage time of the disclosed system is less than the total amount of power supplied to the battery 1400, so that power needs may increase or decrease throughout the day or week and still be met. Thus, a user will perceive the operation of the UI module 400 and switch module 100 to be uniform and identical throughout the day/week. The composition of the limited feature set can be determined by a default setting, dynamically by either processor 151 or 451, or by either processor automatically selecting a profile that defines available functions from among a plurality of pre-determined profiles assigned to various power contexts.

Accordingly, the disclosed electrical control system can automatically operate in electrical boxes whether or not a neutral wire is available. The disclosed electrical control system can also automatically detect different power states and contexts and determine an appropriate power mode to operate in. Furthermore the disclosed electrical control system can adjust power capture amounts based on the operational state of the load and reduce available feature sets to improve the consistency and reliability of operation of the system.

The foregoing description, for purpose of explanation, has been described with reference to specific embodiments. However, the illustrative discussions above are not intended to be exhaustive or to limit embodiments of the disclosed subject matter to the precise forms disclosed. Many modifications and variations are possible in view of the above teachings. The embodiments were chosen and described in order to explain the principles of embodiments of the disclosed subject matter and their practical applications, to thereby enable others skilled in the art to utilize those embodiments as well as various embodiments with various modifications as may be suited to the particular use contemplated.

The invention claimed is:

1. A modular electrical control system for installation in an electrical box of a premises, comprising:
   a switch module having at least an "on" state and an "off" state, being configured to control power delivery to at least one external load, the switch module including a detector that determines whether a neutral wire is connected to the switch module; and
   a removable user interface module configured to connect to the switch module and receive power from the switch module, the removable user interface module including a processor that receives a signal from the switch module indicating whether the neutral wire is present and transmits an instruction to set the switch module to a first power operation mode when then detector determines the neutral wire is connected to the switch module and sets the switch module to a second power operation mode when the detector determines that the neutral wire is not connected to the switch module, wherein the switch module, in the first power operation mode, draws a first amount of power from a live wire of the premises with a return path being established by a connection to the neutral wire, and in the second power operation mode draws a second amount of power from a current that is delivered to the at least one external load.

2. The modular electrical control system of claim 1, wherein the first amount of power is greater than the second amount of power.

3. The modular electrical control system of claim 1, wherein the switch module, when in the "off" state, captures the second amount of power through a TRIAC by allowing a first amount of current to pass through the TRIAC and the at least one external load, the first amount of current being insufficient to power the at least one external load.

4. The modular electrical control system of claim 1, wherein the switch module, when in the "on" state, captures the second amount of power by converting a part of an AC waveform being delivered to the at least one external load, the part of the AC waveform being insufficient to power the at least one external load.

5. The modular electrical control system of claim 1, wherein the second amount of power is lower when the switch module is in the "off" state than it is when the switch module is in the "on" state.

6. The modular electrical control system of claim 1, wherein the second amount of power is approximately 200 mW.

7. The modular electrical control system of claim 1, wherein the removable user interface module is configured to optionally be powered by an internal battery that is charged by power received from the switch module.

8. The modular electrical control system of claim 1, wherein:
the switch module is configured to transmit a second signal to the removable user interface module to cause the removable user interface module to reduce a number of available operational functions when the detector determines that the neutral wire is not connected to the switch module.

9. A modular electrical control system comprising:
a switch module, having at least an "on" state and an "off" state, configured to draw power from an AC power source and to control power delivery to at least one external load, the switch module including a detector that determines whether a neutral wire is connected to the switch module; and
a removable user interface module configured to connect to the switch module and receive power from the switch module,
wherein the switch module delivers a first amount of power to the removable user interface module when the detector determines that the neutral wire is connected to the switch module, and delivers a second amount of power to the removable user interface module lower than the first amount of power when the detector determines that the neutral wire is not connected to the switch module.

10. The modular electrical control system of claim 9, wherein the switch module captures the first amount of power through a closed loop from the AC power source with a return path through the neutral wire.

11. The modular electrical control system of claim 10, wherein the switch module captures the first amount of power in either the "on" state or the "off" state.

12. The modular electrical control system of claim 9, wherein the switch module, when in the "off" state, captures the second amount of power through a TRIAC by allowing a first amount of current to pass through the TRIAC and the at least one external load, the first amount of current being insufficient to power the at least one external load.

13. The modular electrical control system of claim 9, wherein the switch module, when in the "on" state, captures the second amount of power by converting a part of an AC waveform being delivered to the at least one external load, the part of the AC waveform being insufficient to power the at least one external load.

14. The modular electrical control system of claim 9, wherein the second amount of power is lower when the switch module is in the "off" state than it is when the switch module is in the "on" state.

15. The modular electrical control system of claim 9, wherein the second amount of power is approximately 200 mW.

16. The modular electrical control system of claim 9, wherein the removable user interface module is configured to optionally be powered by an internal battery that is charged by power received from the switch module.

17. The modular electrical control system of claim 9, wherein:
the switch module includes a first processor and a first transceiver,
the user interface module includes a second processor and a second transceiver, and
the switch module is configured to transmit a signal to the removable user interface module to cause the removable user interface module to reduce a number of available operational functions when the detector determines that the neutral wire is not connected to the switch module.

18. The modular electrical control system of claim 9, wherein the switch module includes a converter to convert AC power to DC power.

* * * * *